(12) United States Patent
Yan et al.

(10) Patent No.: US 8,149,534 B2
(45) Date of Patent: Apr. 3, 2012

(54) PROTECTIVE COATINGS FOR DATA STORAGE DEVICES

(75) Inventors: Xiaoping Yan, Wexford, PA (US); Lei Li, Wexford, PA (US); Paul Max Jones, St. John, VI (US); Yiao-Tee Hsia, Pleasanton, CA (US)

(73) Assignee: Seagate Technology LLC, Cupertino, CA (US)

( * ) Notice: Subject to any disclaimer, the term of this patent is extended or adjusted under 35 U.S.C. 154(b) by 723 days.

(21) Appl. No.: 12/270,121

(22) Filed: Nov. 13, 2008

(65) Prior Publication Data

US 2010/0118436 A1 May 13, 2010

(51) Int. Cl.
*G11B 5/012* (2006.01)
*G11B 33/14* (2006.01)

(52) U.S. Cl. .................. 360/97.01; 360/97.02
(58) Field of Classification Search ............. 360/97.01
See application file for complete search history.

(56) References Cited

U.S. PATENT DOCUMENTS

| | | | |
|---|---|---|---|
| 4,900,462 A * | 2/1990 | Haag et al. ............. 508/463 |
| 5,075,807 A * | 12/1991 | Inoue et al. ............. 360/97.02 |
| 5,162,163 A * | 11/1992 | Ohta et al. ............. 428/835.6 |
| 5,331,487 A | 7/1994 | Gregory et al. |
| 5,496,607 A * | 3/1996 | Inaba et al. ............. 428/840.6 |
| 5,650,900 A | 7/1997 | Wei et al. |
| 5,652,685 A | 7/1997 | Ketchersid, III |
| 5,820,945 A | 10/1998 | Wei et al. |
| 5,820,964 A * | 10/1998 | Nakakawaji et al. ......... 428/833 |
| 6,317,286 B1 * | 11/2001 | Murphy et al. ............ 360/97.02 |
| 6,379,801 B1 * | 4/2002 | Falcone et al. ............. 428/421 |
| 6,468,596 B1 | 10/2002 | Liu et al. |
| 6,537,686 B1 | 3/2003 | Chen |
| 6,548,140 B1 | 4/2003 | Gui et al. |
| 6,565,718 B1 | 5/2003 | Chour et al. |
| 6,583,953 B1 | 6/2003 | Han et al. |
| 6,638,622 B2 * | 10/2003 | Dai et al. ............. 428/408 |
| 6,643,093 B2 * | 11/2003 | Brown et al. ............ 360/97.02 |
| 6,762,909 B2 * | 7/2004 | Albrecht et al. .......... 360/97.02 |
| 6,932,890 B2 * | 8/2005 | Dai et al. ............. 204/192.15 |
| 6,940,692 B2 * | 9/2005 | Dai et al. ............. 360/125.72 |
| 7,323,416 B2 | 1/2008 | Liu et al. |
| 7,833,641 B2 * | 11/2010 | Tomiyasu et al. .......... 428/835.8 |
| 7,929,255 B2 * | 4/2011 | Umezaki et al. ............. 360/270 |
| 2006/0098342 A1 * | 5/2006 | Matsumoto et al. ......... 360/133 |
| 2006/0105204 A1 * | 5/2006 | Takahashi ............. 428/833.6 |
| 2006/0163532 A1 * | 7/2006 | D'Aprile et al. ......... 252/182.11 |
| 2007/0019323 A1 | 1/2007 | Li et al. |
| 2007/0184308 A1 | 8/2007 | Hintz |
| 2008/0056629 A1 * | 3/2008 | Nakano et al. ............. 384/100 |
| 2009/0059416 A1 * | 3/2009 | Okada et al. .............. 360/75 |
| 2009/0137439 A1 * | 5/2009 | Dinh et al. ............. 510/170 |
| 2010/0002282 A1 * | 1/2010 | Agrawal et al. ............. 359/275 |

* cited by examiner

*Primary Examiner* — Son Mai
(74) *Attorney, Agent, or Firm* — Brian R. Morrison; Westman, Champlin & Kelly, P.A.

(57) ABSTRACT

A data storage device comprising a storage medium having a recordable surface, a transducing head having a bearing surface positioned adjacent to the recordable surface of the storage medium, and at least one compound disposed between the recordable surface and the bearing surface, the at least one compound comprising at least one functional group that imparts corrosion resistance and at least one functional group that imparts lubricating properties.

15 Claims, 4 Drawing Sheets

PROTECTIVE COATINGS FOR DATA STORAGE DEVICES

BACKGROUND

The present disclosure relates to data storage devices. In particular, the present disclosure relates to assemblies and techniques for restoring protective coatings on storage media and transducing heads.

Data storage devices, such as disk drives, typically store information on surfaces of storage media, such as magnetic or optical disks. In a typical disk drive, one or more disks are mounted together on a spindle motor. The spindle causes the disk(s) to spin and the data surfaces of the disk(s) to pass under respective bearing sliders. A transducing head carried by a slider is used to read from and write to a data track on a disk. The slider is typically carried by a head arm assembly that includes an actuator arm and a suspension assembly, which can include a separate gimbal structure or can integrally form a gimbal. During operation, as the disk spins, the slider glides above the surface of the disk on a small cushion of air, and the actuator arm pivots to movably position the slider with respect to the disk.

For consistency and predictability, it is desirable to maintain each transducing head as close to its associated recording surface as possible (i.e., to minimize the head/media spacing). The bearing surfaces of the disk and the transducing head each typically include an overcoat to provide protection against wear and corrosion. Excessive wear of the protective overcoat increases friction between the head and disk, which may potentially result in a drive failure. Furthermore, in accordance with conventional practices, a lubricant topcoat may be applied over the protective overcoat to prevent wear between the disk and head interface during drive operation. However, the use of the protective overcoats and the lubricant topcoats increase the head/media spacing, which may affect the areal density capabilities of the data storage device. Furthermore, over extended periods of use, the lubricant topcoats and the protective overcoats may be eroded, thereby exposing the underlying bearing surfaces of the storage media and the transducing head.

SUMMARY

An aspect of the disclosure is directed to a data storage device that includes a storage medium having a recordable surface, and a transducing head having a bearing surface positioned adjacent to the recordable surface of the storage medium. The data storage device also includes a compound disposed between the recordable surface and the bearing surface, where the compound includes at least one functional group that imparts corrosion resistance and at least one functional group that imparts lubricating properties.

Another aspect of the disclosure is directed to a data storage device that includes a device housing defining an internal volume, a storage medium disposed within the internal volume and having a recordable surface, and a transducing head disposed within the internal volume and having a bearing surface positioned adjacent to the recordable surface. The data storage device also includes a volatile compound disposed within the internal volume, where the volatile compound includes at least one functional group that imparts corrosion resistance and at least one functional group that imparts lubricating properties.

A further aspect of the disclosure is directed to a method of using a data storage device. The method includes releasing a vapor to an interface between opposing surfaces of a storage medium and a transducing head, where the vapor comprises a volatile compound having at least one functional group that imparts corrosion resistance and at least one functional group that imparts lubricating properties. The method also includes operably adsorbing the volatile compound onto at least one of the opposing surfaces.

DETAILED DESCRIPTION

Figure 1:
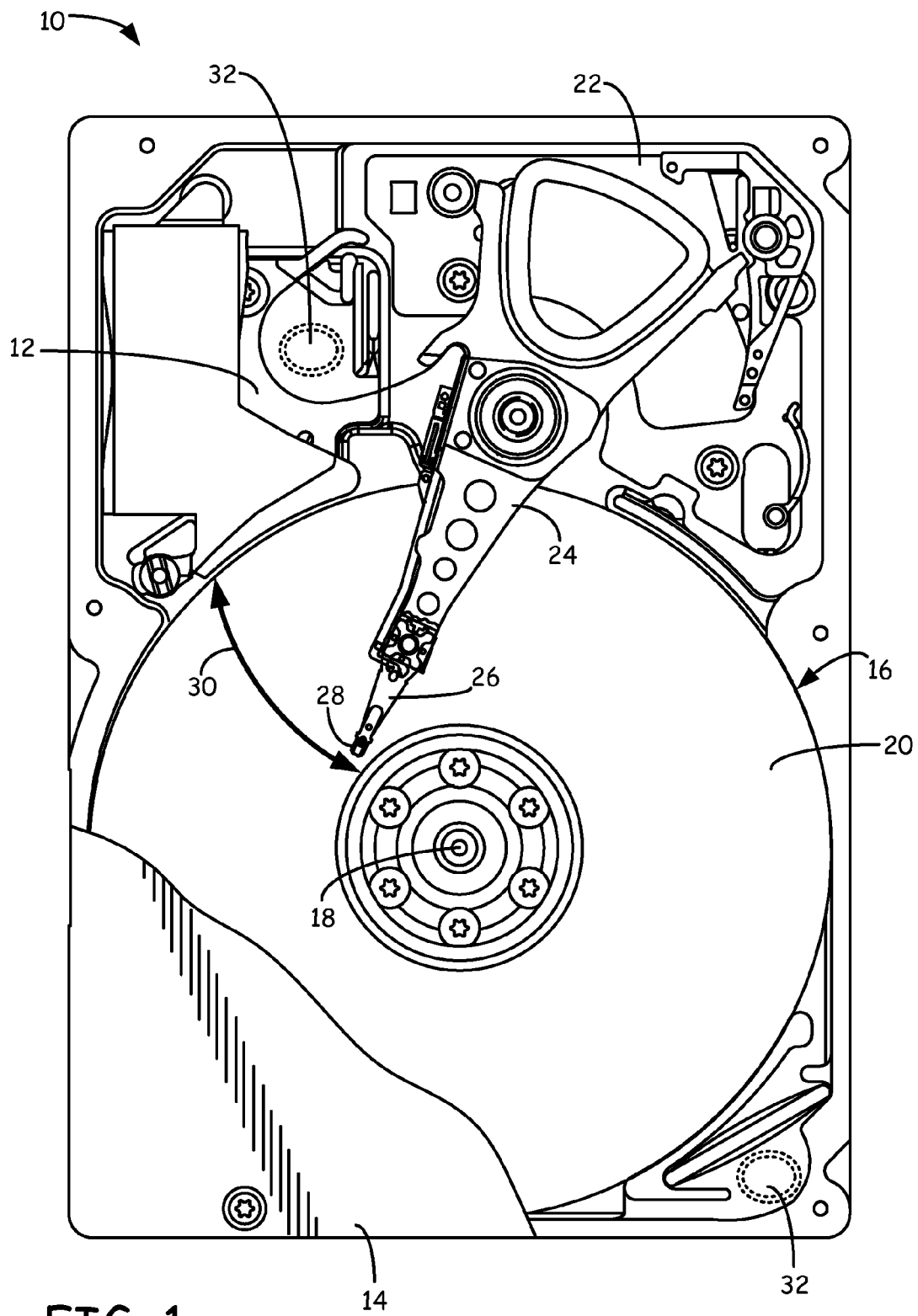
FIG. 1 is a plan view of a disk drive having multiple vapor sources of a multi-functional volatile compound.

FIG. 1 is a plan view of disk drive 10, which is an exemplary data storage device (e.g., a hard disk drive) for storing and transferring digital data with a host device (not shown). As shown, the components of disk drive 10 are retained between base 12 and top cover 14 (shown in partial cut-away), which mate to form a partially or fully sealed housing. Disk drive 10 also includes storage disk 16 and spindle motor 18, where spindle motor 18 rotates storage disk 16 in a rotational direction during operation. Storage disk 16 includes recordable surface 20, which is a surface of storage disk 16 having one or more recordable regions, and, as discussed below, may include a protective overcoat and/or a lubricating topcoat.

Disk drive 10 further includes actuation motor 22 (e.g., a voice coil motor), actuator arm 24, suspension assembly 26, and slider 28, where slider 28 carries a transducing head (not shown in FIG. 1). Slider 28 is supported by suspension assembly 26, which in turn is supported by actuator arm 24. Actuation motor 22 is configured to pivot actuator arm 24 about an axis in order to sweep suspension assembly 26 and slider 28 in an arc across recordable surface 20 (represented by arrow 30), where slider 28 desirably floats above recordable surface 20 on a cushion or air. An additional microactuation system (not shown) may also be used to produce precise, small-scale movements of suspension assembly 26 and slider 28. As slider 28 moves across recordable surface 20, the transducing head carried by slider 28 may be positioned relative to selected data tracks located on recordable surface 20. This allows the transducing head to write data to, and read from, the data tracks on recordable surface 20 during operation.

Disk drive 10 also desirably includes one or more vapor sources 32, which permeate or otherwise emit vapors of at least one multi-functional volatile (MFV) compound. As discussed below, the MFV compound is suitable for restoring eroded portions of the protective overcoat and/or lubricant topcoat on recordable surface 20, and on the bearing surface of the transducer (not shown in FIG. 1). Furthermore, the MFV compound desirably includes at least one functional group that imparts corrosion resistance and at least one functional group that imparts lubricating properties. This allows the MFV compound to provide both corrosion resistance and lubricating properties. In comparison, mono-functional volatile corrosion inhibitors (e.g., benzotriazoles) are typically not compatible with lubricating compounds (e.g., perfluoropolymers), thereby reducing their combined effectiveness as coatings for data storage devices. Thus, the mere addition of a mono-functional volatile corrosion inhibitor to a lubricant topcoat does not effectively provide both corrosion resistance and lubricating properties.

Figure 2:
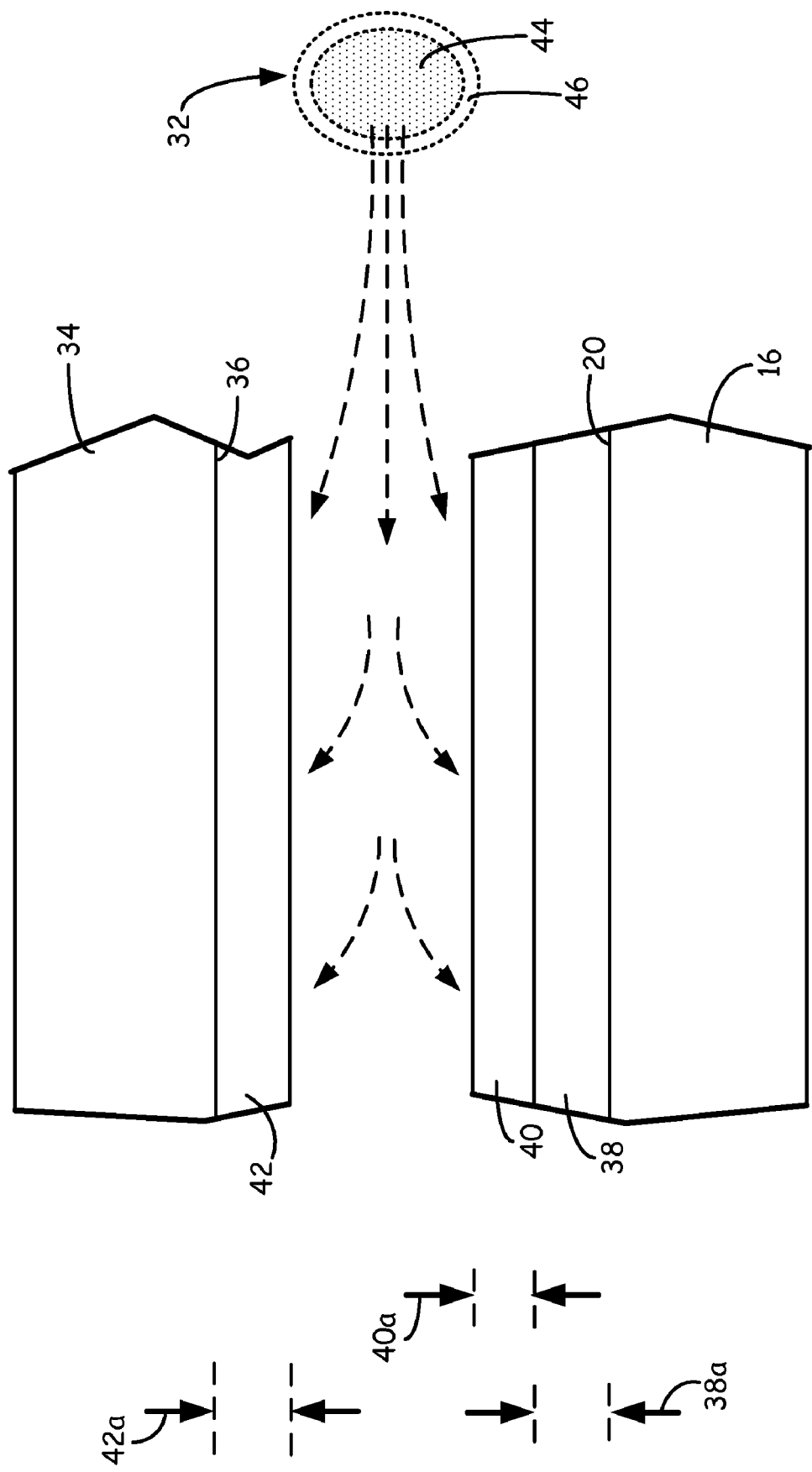
FIG. 2 is a side schematic illustration of an interstitial space between a storage disc and a transducing head of the disk drive.

FIG. 2 is a side schematic illustration of storage disk 16 and transducing head 34 of slider 28, where transducing head 34 includes bearing surface 36. As shown, recordable surface 20 of storage disk 16 is protected by overcoat 38 and topcoat 40, and bearing surface 36 is protected by overcoat 42. Overcoats 38 and 42 are protective overcoats (e.g., diamond-like carbon overcoats) that provide abrasion resistance to recordable surface 20 and bearing surface 36, respectively. Overcoats 38 and 42 may each be formed using a variety of physical vapor deposition techniques, such as sputtering techniques. As discussed below, the use of vapors of the MFV compounds allow thinner overcoat thicknesses to be used while substantially preserving the protective properties of the coatings over extended periods of use. The use of thinner coating thicknesses allows the head/media spacing of disk drive 10 to be reduced, thereby allowing the areal density of disk drive 10 to be increased. Accordingly, suitable coating thicknesses for overcoat 38 (referred to as coating thickness 38a) range from about 1.5 nanometers to about 4.0 nanometers, with particularly suitable coating thicknesses for over coat 38 ranging from about 1.5 nanometers to about 2.5 nanometers. Suitable coating thicknesses for overcoat 42 (referred to as coating thickness 42a) range from about 0.5 nanometers to about 3.0 nanometers, with particularly suitable coating thicknesses for over coat 38 ranging from about 0.5 nanometers to about 1.5 nanometers.

Topcoat 40 is desirably a lubricating coating disposed on overcoat 38, and may be formed with a variety of lubricating materials. Examples of suitable lubricating materials for topcoat 40 include fluoropolymers, such as perfluoropolyethers commercially available under the trademark "FOMBLIN" Z and Y Lubricants from Solvey Solexis, Inc., West Deptford, N.J.; and under the trade mark "Moresco" lubricants from Matsumura Oil Research Corp., and under the trade mark "Krytox" from Du Pont Corp. Topcoat 40 may be formed using a variety of coating techniques, such as dipping, vapor-lubricant deposition and electrospraying techniques. Topcoat 40 may also be surface treated to enhance coating properties via a variety of post-coating treatment techniques, such as thermal treatment, light irradiation (e.g. UV, IR etc.), e-beam, gamma irradiation and backend processing techniques. The use of vapors of the MFV compounds also allows a thinner topcoat thickness to be used while substantially preserving the lubricating properties of topcoat 40 over extended periods of use. This allows the head/media spacing of disk drive 10 to be further reduced. Suitable coating thicknesses for topcoat 40 (referred to as coating thickness 40a) range from about 0.5 nanometer to about 2.0 nanometers, with particularly suitable coating thicknesses for topcoat 40 range from about 0.5 nanometers to about 1.0 nanometer.

As shown in FIG. 2, overcoats 38 and 42 and topcoat 40 protect recordable surface 20 and bearing surface 36 from abrasive contact during operation of disk drive 10. However, over extended periods of use, one or more of overcoats 38 and 42 and topcoat 40 may erode due to the abrasive contact. To reduce the risk of a drive failure, one or more vapor sources 32 emit vapors of the MFV compound(s) having corrosion resistance and lubricating properties. The MFV compounds of the emitted vapors desirably adsorb into the eroded surfaces of one or more of overcoat 38, topcoat 40, and overcoat 42. The corrosion resistance and lubricating properties of the adsorbed MFV compounds replenish the given coatings, thereby providing corrosion resistance and lubricating properties at the adsorption sites. This extends the operational life of disk drive 10 by reducing the risk of bearing surface 36 coming into direct contact with recordable surface 20 of storage disk 16.

Vapor sources 32 each desirably include source material 44 disposed within package 46. Source material 44 is a source of the one or more MFV compounds, and may be provided in a variety of solid media, liquid media, slurry media, or combinations thereof. In one embodiment, source material 44 is provided as a solid media (e.g., pellets and powders) encapsulated within package 46. At least one of the MFV compounds includes at least one functional group that imparts corrosion resistance and at least one functional group that imparts lubricating properties. More desirably, each of the MFV compounds includes at least one functional group that imparts corrosion resistance and at least one functional group that imparts lubricating properties.

Suitable functional groups that impart corrosion resistance include triazole groups (e.g., 1,2,3-triazole and 1,2,4-triazole groups), organic amines, organic salts thereof, inorganic salts thereof, and combinations thereof. Suitable functional groups that impart lubricating properties include fluorinated polyether groups (e.g., perfluoropolyethers), alkylated and aromatic polyether groups (e.g., polyethylethers and polyphenyl ethers), and phosphazine groups (e.g., X-1P); and may constitute one or more segments of the backbone chain of the given MFV compound, and/or one or more chain branches of the given MFV compound. Examples of suitable MFV compounds having at least one functional group that imparts corrosion resistance and at least one functional group that imparts lubricating properties include compounds having the following molecular formulas:

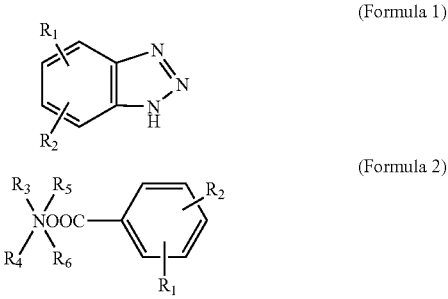

(Formula 1)

(Formula 2)

where $R_1=\{X-(OY)_n-\}$ and $R_2$, $R_3$, $R_4$, $R_5$, $R_6=\{X-(OY)_m-\}$ or $\{X-(Y)_m-\}$, and where $R_2$ through $R_6$ may be the same or different groups. Suitable values for "n" range from 1 to 12, with particularly suitable values for "n" ranging from 1 to 7. Suitable values for "m" range from 0 to 10, with particularly suitable values for "m" ranging from 0 to 7. "X" may include a partially fluorinated group, a perfluroinated group (e.g., $CF_3$, $CF_3CF_2$, $CF_3CF_2CF_2$, and $CF(CF_3)_2$, hydrogen (H), a saturated organic group (e.g., $C_pH_{2p+1}$, p=1-6), or a saturated alcohol group (e.g., $C_pH_{2p}OH$, p=1-6). "Y" may include a partially fluorinated group, a perfluroinated group (e.g., $C_pF_{2p}$, p=1-6), a branched perfluroinated group (e.g., $CF(CF_3)$, $C(CF_3)_2$, and $CF(CF_3)CF_2$, $CF(CF_3)CF_2CF_2$), $C_6H_4$, or a saturated organic group (e.g., $C_pH_{2p}$, p=1-6). Suitable MFV compounds exhibiting such structures include fluorinated (e.g., perfluorinated)-derivitized benzotriazoles, fluorinated (e.g., perfluorinated)-derivitized benzoates, and combinations thereof.

In comparison to mono-functional volatile corrosion inhibitors (e.g., benzotriazoles), the one or more of the MFV compounds of source material 44 are substantially miscible in the lubricating materials of topcoat 40. This allows the MFV compounds to readily adsorb onto topcoat 40 and to at least partially diffuse into topcoat 40. Furthermore, the MFV compounds provide both corrosion resistance and lubricating properties to overcoat 38, topcoat 40, and/or overcoat 42. This protects recordable surface 20 and one or more portions of bearing surface 36 (e.g., the pole tips) from corroding, which may otherwise accelerate mechanical failure of disk drive 10. The MFV compound(s) also increase the lubrication between recordable surface 20 and bearing surface 36, thereby reducing the risk of abrasive contact between the given surfaces.

Source material 44 may also include additional additives to assist in the use of the one or more MFV compounds, and to assist in the manufacturing of source material 44 and/or package 46. Suitable additives for source material 44 include rheology modifiers, stabilizers, plasticizers, and additional volatile compounds. Examples of suitable additional volatile compounds include mono-functional volatile lubricants, mono-functional volatile corrosion inhibitors, and combinations thereof. Suitable mono-functional volatile lubricants include fluorinated polymers (e.g., perfluoropolyethers), polyphenyl ethers, polyalkylene oxides, and combinations thereof. The molecular weights of such materials are desirably low enough to provide vaporization temperatures ranging from about 20° C. to about 100° C. In embodiments in which source material 44 includes mono-functional volatile lubricants, examples of suitable concentrations of the mono-functional volatile lubricants range from about 0.1% by weight to about 40% by weight, with particularly suitable concentrations of the volatile lubricants ranging from about 1% by weight to about 20% by weight, based on an entire weight of source material 44.

Suitable mono-functional volatile corrosion inhibitors include triazoles (e.g., benzotriazoles, tolytriazoles, benzimidazoles, and derivatives thereof), organic nitrites, inorganic nitrites, nitrates, carboxylates, phosphates, amines (e.g., cyclohexyl ammonium benzoate and dicyclohexylammonium benzoate), acid thereof, esters thereof, salts thereof, and combinations thereof. As discussed above, mono-functional volatile corrosion inhibitors are not miscible in topcoat 40. Thus, in embodiments in which source material 44 includes mono-functional volatile corrosion inhibitors, the concentrations of these materials in source material 44 are desirably low. Examples of suitable concentrations of the mono-functional volatile corrosion inhibitors range from about 0.1% by weight to about 10% by weight, with particularly suitable concentrations of the volatile lubricants ranging from about 1% by weight to about 5% by weight, based on an entire weight of source material 44.

Package 46 may be any type of package suitable for retaining source material 44 and for allowing the vapors of the MFV compounds to permeate from, diffuse through, or otherwise emit from package 46 at a rate that is suitable to maintain a desired partial pressure within the housing of disk drive 10. In one embodiment, package 46 is a polymeric package that encapsulates source material 44 and that is permeable to the vapors of the MFV compounds of source material 44. Suitable polymeric materials for package 46 include any material that may be manufactured to the desired dimensions of package 46 and that may be rendered permeable, such as thermoplastic polyolefin materials (e.g., polyethylenes and polypropylenes). The polymeric materials may be rendered porous using conventional techniques, such as polymer stretching and blowing techniques. In alternative embodiments, package 46 may exhibit a polymeric matrix infused with source material 44 (e.g., in a liquid or slurry state). In these embodiments, the vapors of the MFV compounds also desirably emit from package 46 at a rate that is suitable to maintain a desired partial pressure within the housing of disk drive 10, where the housing is partially or fully enclosed.

During operation, the relative movements of storage disk 16 and transducing head 34 may eventually erode one or more portions of overcoat 38, topcoat 40, and/or overcoat 42. However, the vapors of the MFV compounds of source material 44 emit from package 46 to attain a suitable concentration within the internal volume defined by the housing of disk drive 10. Accordingly, suitable partial pressures of the vapors of the MFV compounds within the internal volume of disk drive 10 range from about $10^{-5}$ Pascals to about $10^3$ Pascals, with particularly suitable partial pressures ranging from about $10^{-3}$ Pascals to about 1 Pascal, for temperatures ranging from about 20° C. to about 100° C. These partial pressures provide suitable concentrations of the MFV compounds in the interstitial region between storage disk 16 and transducing head 34.

The surrounding vapors of the MFV compounds adsorb to the eroded surfaces of overcoat 38, topcoat 40, and/or overcoat 42, thereby growing layers of the MFV compounds at the exposed surfaces and within pin holes of overcoats 38 and/or 42. The corrosion-resistance functional groups of the MFV compounds protect the underlying metal surfaces (i.e., recordable surface 20 and bearing surface 36) from being corroded. Furthermore, the lubricating-functional groups of the MFV compounds render the MFV compounds at least partially miscible in the lubricating material of topcoat 40, and replenish the lubricating properties of topcoat 40. As discussed above, these attributes extend the operational life of disk drive 10 by reducing the risk of bearing surface 36 coming into direct contact with recordable surface 20 of storage disk 16.

Figure 3:
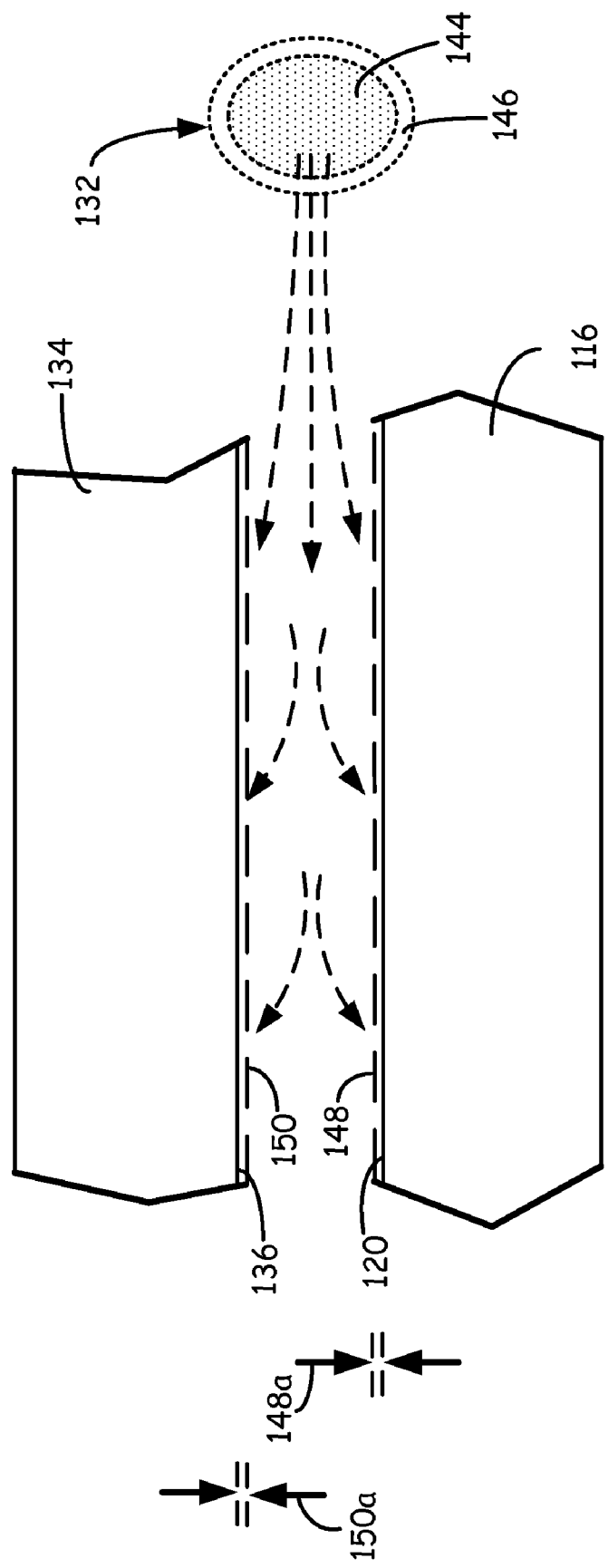
FIG. 3 is a side schematic illustration of an interstitial space between an alternative storage disk and an alternative transducing head of the disk drive.

FIG. 3 is a side schematic illustration of storage disc 116 and transducing head 134 of disk drive 110, which illustrates an alternative embodiment to disk drive 10 (shown in FIGS. 1 and 2), where respective reference labels are increased by "100". In the embodiment shown in FIG. 3, recordable surface 120 and bearing surface 136 do not contain pre-applied overcoats or topcoats. This allows the head/media spacing between recordable surface 120 and bearing surface 136 to be reduced (e.g., below about 5 nanometers), thereby allowing the areal density to be increased. Accordingly, during the manufacturing of disk drive 110, one or more vapor sources 132 may be placed within the housing of disk drive 110 in the same manner as discussed above for disk drive 10. Suitable materials for source material 144 and package 146 of vapor source 132 include those discussed above for vapor source 32.

The placement of one or more vapor sources 132 within the housing of disk drive 110 allows the vapors of the MFV compounds of source material 144 to emit into the interstitial regions between recordable surface 120 and bearing surface 136. The vapors of the MFV compounds desirably emit from package 146 to attain a suitable concentration within the housing of disk drive 110. Suitable partial pressures of the vapors of the MFV compounds within the housing of disk drive 110 include those discussed above for disk drive 10. The MFV compounds from the vapors may then adsorb onto recordable surface 120 and/or bearing surface 136 to form protective coatings 148 and 150, respectively.

The coating thicknesses for protective coatings 148 and 150 are each based on the concentrations of the vapors of the MFV compounds within the housing of disk drive 110, the materials of surfaces 120 and 136, and the MFV compounds may continue to adsorb to recordable surface 120 and/or bearing surface 136 until an equilibrium is achieved between the deposited MFV compounds and the vapor-phased MFV compounds. Thus, the coating thicknesses for protective coatings 148 and 150 (referred to as coating thicknesses 148a and 150a, respectively) may be controlled by the partial pressure of the vapor of the MFV compounds within the housing of disk drive 110. Because the MFV compounds each desirably provide both corrosion resistance and lubricating properties, protective coatings 148 and 150 may each exhibit small coating thicknesses. This further allows a small head/media spacing to be attained. Accordingly, suitable coating thicknesses for each of protective coatings 148 and 150 range from about 0.1 nanometers to about 3.0 nanometers, with particularly suitable coating thicknesses ranging from about 0.5 nanometers to about 1.0 nanometers.

Disk drives 10 and 110 illustrate suitable data storage devices that may be protected with the use of MFV compounds of the present disclosure. In additional alternative embodiments, disk drives 10 and 110 may include a variety of additional features. For example, the MFV compounds of the present disclosure are also suitable for use with a disk drive that only contain protective overcoats on the recordable surface of the storage disk and/or the bearing surfaces of the transducing head. Accordingly, the MFV compounds are beneficial for providing corrosion resistance and lubricating properties to a variety of different data storage devices.

Figure 4:
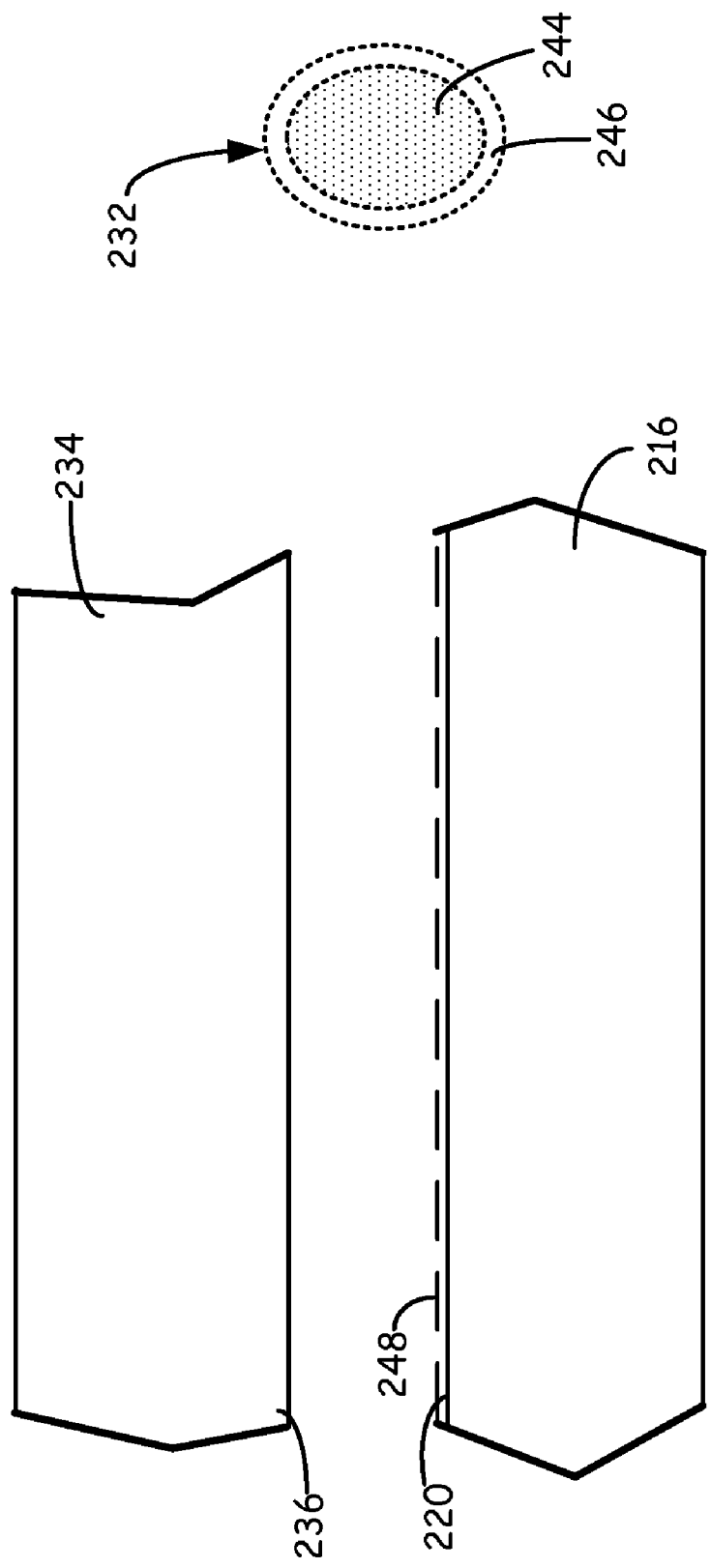
FIG. 4 is a side schematic illustration of an interstitial space between a second alternative storage disk and a second alternative transducing head of the disk drive.

FIG. 4 is a side schematic illustration of storage disc 216 and transducing head 234 of disk drive 210, which illustrates an additional alternative embodiment to disk drive 10 (shown in FIGS. 1 and 2), where respective reference labels are increased by "200". In the embodiment shown in FIG. 4, recordable surface 220 and bearing surface 236 also do not contain pre-applied overcoats or topcoats. This allows the head/media spacing between recordable surface 220 and bearing surface 236 to be reduced (e.g., below about 5 nanometers), thereby allowing the areal density to be increased. In this embodiment, protective coating 248 is formed on recordable surface 220 during manufacture of disk drive 210. In an alternative embodiment, a corresponding protective coating (not shown) may also be formed on bearing surface 236. This is beneficial for providing corrosion resistance and lubricating properties provided to recordable surface 220 and/or bearing surface 236.

In one embodiment, protective coating 248 includes the above-discussed MFV compounds. Alternatively, protective coating 248 may include multi-functional liquid (MFL) compounds having at least one functional group that imparts corrosion resistance and at least one functional group that imparts lubricating properties. Examples of suitable MFL compounds include the above-discussed, multi-functional compounds, where the multi-functional compounds are in a substantially non-volatile state.

Protective coating 248 may be formed using conventional coating techniques, such as dip lubing, vapor lubing, and electrospraying techniques, where the given technique used includes the above-discussed compounds. Protective coating 248 may also be treated to enhance coating properties including thermal stability and bonding strength via a variety of post-coating treatment techniques, such as thermal treatment, light irradiation (e.g. UV, IR etc.), e-beam, gamma irradiation and backend processing techniques. Suitable coating thicknesses for protective coating 248 include those discussed above for protective coating 148 (shown in FIG. 3). For example, in the above-discussed Formulas 1 and 2, "n" may range from 1 to 1,000 and "m" may range from 0 to 1,000. In one embodiment, one or more vapor sources 132 may also be placed within the housing of disk drive 210 in the same manner as discussed above for disk drive 10. Suitable materials for source material 244 and package 246 of vapor source 232 include those discussed above for vapor source 32. This embodiment allows the vapors of the MFV compounds of source material 244 to emit into the interstitial regions between recordable surface 220 and bearing surface 236, as discussed above. This further increases corrosion resistance and lubricating properties provided to recordable surface 220 and/or bearing surface 236 by providing a technique for replenishing the supply of the MFV compounds when one or more portions of the protective coatings (e.g., protective coating 248) are eroded.

EXAMPLES

The following comparative examples were performed to illustrate the limitations of mono-functional volatile compounds. Unless otherwise noted, all parts, percentages, and ratios reported in the following examples are on a weight basis, and all reagents used in the examples were obtained, or are available, from the chemical suppliers described below, or may be synthesized by conventional techniques.

Samples of Comparative Examples 1 and 2 were added to a vial containing a hard disk lubricant solvent commercially available under the trademark "VERTREL" from E. I. du Pont de Nemours and Company, Wilmington, Del. to determine their compatibilities with the hard disk lubricant. Comparative Example 1 was a perfluoropolyether (i.e., a mono-functional volatile lubricant) and Comparative Example 2 was a mixture of the perfluoropolyether of Comparative Example 1 and benzotriazole (i.e., a mono-functional volatile corrosion inhibitor). Thus, Comparative Example 2 included a mixture of mono-functional volatile compounds, where the perfluoropolyether provided lubricating properties and the benzotriazole provided corrosion resistance. This is in contrast to the MFV compound of the present disclosure, in which a single compound imparted both lubricating properties and corrosion resistance.

The sample of Comparative Example 1 readily mixed with the hard disk lubricant to provide a clear solution in the vial that contained no visible solids. This result corresponded to the expected results for low-molecular weight perfluoropolyethers. However, the perfluoropolyether did not impart corrosion resistance, thereby reducing its effectiveness in protecting the surfaces of storage disks and transducing heads. Furthermore, the sample of Comparative Example 2 did not mix with the hard disk lubricant, and solid chunks were visibly suspended in the hard disk lubricant for more than seven days. Thus, the combination of the separate mono-functional volatile compounds did not render the benzotriazole miscible in the hard disk fluid. This corresponded to the results disclosed in Weinberg, Joseph H., *Investigation of Volatile Corrosion Inhibitor Additives For Standard Operating Oils to Improve Their Preservative Characteristics*, Rock Island Arsenal Laboratory Technical Report, Dec. 21, 1964. The non-miscibility of the benzotriazole would restrict the dispersibility of the material in the hard disk lubricant, thereby reducing its effectiveness in providing corrosion resistance. Thus, the mere addition of a mono-functional volatile corrosion inhibitor to a lubricant topcoat does not effectively provide both corrosion resistance and lubricating properties.

In comparison, the MFV compound of the present disclosure provides corrosion resistance, and is substantially miscible in lubricating hard disk lubricants due to the lubricant functionality. This allows the MFV compounds to readily adsorb onto the lubricant topcoats and to at least partially diffuse into the given topcoats. Accordingly, the MFV compound protects recordable surfaces of storage disks and bearing surfaces of transducing heads from corroding, which may otherwise accelerate mechanical failure of the data storage devices. The MFV compound also increases the lubrication between recordable surfaces and bearing surfaces, thereby reducing the risk of abrasive contact between the given surfaces.

Although the present disclosure has been described with reference to preferred embodiments, workers skilled in the art will recognize that changes may be made in form and detail without departing from the spirit and scope of the disclosure.

The invention claimed is:

1. A data storage device comprising:
   a storage medium having a recordable surface;
   a transducing head having a bearing surface positioned adjacent to the recordable surface of the storage medium; and
   multi-functional compound located between the recordable surface and the bearing surface, the multi-functional volatile compound comprising at least one aromatic functional group that imparts corrosion resistance and at least one functional group that imparts lubricating properties.

2. The data storage device of claim 1, wherein the at least one aromatic functional group that imparts corrosion resistance is selected from the group consisting of triazole groups, organic amines, organic acids, organic esters, organic salts thereof, inorganic salts thereof, and combinations thereof.

3. The data storage device of claim 1, wherein the at least one functional group that imparts lubricating properties comprises a fluorinated group.

4. The data storage device of claim 1, wherein the multi-functional volatile compound is selected from the group consisting of a fluorinated-derivitized benzotriazole, and a fluorinated-derivitized benzoate.

5. The data storage device of claim 4, wherein the fluorinated-derivitized benzotriazole comprises a compound having the molecular formula

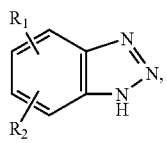

wherein $R_1=\{X_1—(OY_1)_n—\}$ and $R_2=\{X_2—(OY_2)_m—\}$ or $\{X_2—(Y_2)_m—\}$, wherein "$X_1$" and "$X_2$" are each selected from the group consisting of $CF_3$, $CF_3CF_2$, $CF_3CF_2CF_2$, $CF(CF_3)_2$, H, a saturated organic group, and a saturated alcohol group, wherein "$Y_1$" and "$Y_2$" are each selected from the group consisting of a perfluorinated group, a branched perfluroinated group, $C_6H_4$, and a saturated organic chain, wherein "n" ranges from 1 to 1,000, and wherein "m" ranges from 0 to 1,000.

6. The data storage device of claim 5, wherein "n" ranges from 1 to 12, and "m" ranges from 0 to 10.

7. The data storage device of claim 1, wherein the fluorinated-derivitized benzoate comprises a compound having the molecular formula

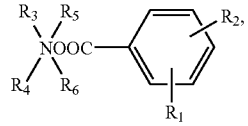

wherein $R_1=\{X_1—(OY_1)_n—\}$, $R_2=\{X_2—(OY_2)_m\}$ or $\{X_2—(Y_2)_m—\}$, $R_3=\{X_3—(OY_3)_r—\}$ or $\{X_3—(Y_3)_r—\}$, $R_4=\{X_4—(OY_4)_q—\}$ or $\{X_4—(Y_4)_q—\}$, $R_5=\{X_5—(OY_5)_s—\}$ or $\{X_5—(Y_5)_s—\}$, $R_6=\{X_6—(OY_6)_t—\}$ or $\{X_6—(Y_6)_t—\}$, wherein "$X_1$", "$X_2$", "$X_3$", "$X_4$", "$X_5$" and "$X_6$" are each selected from the group consisting of $CF_3$, $CF_3CF_2$, $CF_3CF_2CF_2$, $CF(CF_3)_2$, H, a saturated organic group, and a saturated alcoholic group, wherein "$Y_1$", "$Y_2$", "$Y_3$","$Y_4$", "$Y_5$" and "$Y_6$" are each selected from the group consisting of a perfluorinated group, a branched perfluroinated group, $C_6H_4$, and a saturated organic chain, wherein "n" ranges from 1 to 1,000, and wherein "m", "q", "r", "s" and "t" each range from 0 to 1,000.

8. The data storage device of claim 7, wherein "n" ranges from 1 to 12, and "m" ranges from 0 to 10.

9. A compound comprising:
   a multi-functional volatile compound, the multi-functional volatile compound comprising at least one aromatic functional group capable of imparting corrosion resistance for an adjacent surface and at least one functional group capable of imparting lubricating properties for the adjacent surface.

10. The compound of claim 9, wherein the at least one aromatic functional group that imparts corrosion resistance is selected from the group consisting of triazole groups, organic amines, organic acids, organic esters, organic salts thereof, inorganic salts thereof, and combinations thereof.

11. The compound of claim 9, wherein the at least one functional group that imparts lubricating properties comprises a fluorinated group.

12. The compound of claim 9, wherein the multi-functional volatile compound is selected from the group consisting of a fluorinated-derivitized benzotriazole and a fluorinated-derivitized benzoate.

13. The compound of claim 9, and further comprising a package configured to retain the multi-functional volatile compound, wherein vapor of the multi-functional volatile compound is configured to permeate through the package.

14. The compound of claim 9, wherein a vapor of the multi-functional volatile compound exhibits a partial pressure within the internal volume that ranges from about $10^{-5}$ Pascals to about $10^3$ Pascals for temperatures ranging from about 20° C. to about 100° C.

15. The compound of claim 9, wherein the adjacent surface comprises a coating selected from the group consisting of a carbon-based overcoat, a lubricant topcoat, and combinations thereof.

* * * * *